(12) United States Patent
Yamada (10) Patent No.: US 6,762,504 B1
(45) Date of Patent: Jul. 13, 2004

(54) RELEASE FILMS AND ADHESIVE FILMS USING THE RELEASE FILMS

(75) Inventor: Yukio Yamada, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 10/172,383

(22) Filed: Jun. 14, 2002

(30) Foreign Application Priority Data

Jun. 14, 2001 (JP) ........................................ 2001-179561

(51) Int. Cl.⁷ ............................................ H01L 21/48
(52) U.S. Cl. ...................................... 257/782; 438/118
(58) Field of Search ................................. 257/782, 783; 438/118, 119

(56) References Cited

FOREIGN PATENT DOCUMENTS

| JP | 05154857 | * | 6/1993 | |
| JP | 5-154857 | | 6/1993 | ........... B29C/41/12 |
| JP | 1192720 | * | 4/1999 | |

OTHER PUBLICATIONS

Patent Abstract of Japan, Publication No. 05–154857, publication date Jun. 22, 1993, 2 pages.

* cited by examiner

Primary Examiner—Nathan J. Flynn
Assistant Examiner—Leonardo Andújar
(74) Attorney, Agent, or Firm—Rosenthal & Osha L.L.P.

(57) ABSTRACT

The present invention provides an adhesive film for producing an electric device having high reliability. Release agent layer of release film of the present invention is based on a fluorine compound with no silicone oil so that the adhesive force between substrate and release agent layer is enough high to provide an electric device having high reliability wherein release agent layer is not adhered when release film is separated from adhesive layer. The surface roughness of substrate of 3 μm or less limits irregularities on the side of adhesive layer from which release film has been separated and therefore, no bubbles occur between adhesive layer and semiconductor chip when semiconductor chip is pressed against adhesive layer. If the surface roughness of substrate is 1 μm or more, adhesive film also has high slitting performance.

9 Claims, 5 Drawing Sheets

RELEASE FILMS AND ADHESIVE FILMS USING THE RELEASE FILMS

FIELD OF THE INVENTION

The present invention relates to release films used for adhesive films, and particularly release films used for anisotropic conductive adhesive films.

BACKGROUND OF THE INVENTION

Adhesive films have been widely used to bond a semiconductor chip to a wiring board.

Figure 5A:
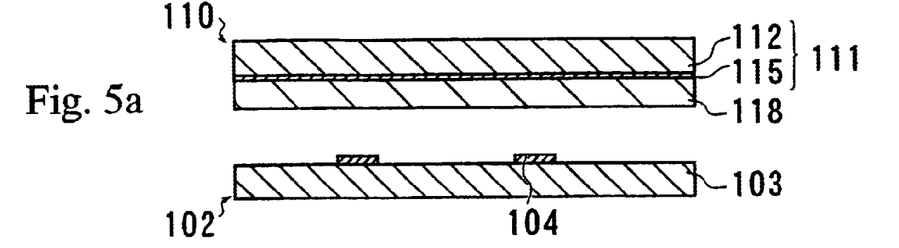

Reference 110 in FIG. 5(a) represents an adhesive film of the prior art. Adhesive film 110 comprises a release film 111 and an adhesive layer 118 adhered to the surface of release film 111.

Release film 111 comprises a substrate 112 and a release agent layer 115 formed on the surface of substrate 112, and release agent layer 115 is provided on the side of release film 111 adhered to adhesive layer 118.

Reference 102 in FIG. 5(a) represents a wiring board. Wiring board 102 comprises a base film 103 and metal lines 104 provided on the surface of base film 103. For connecting this wiring board 102 to a semiconductor chip described below, the side of adhesive film 110 having adhesive layer 118 is first pressed against the side of wiring board 102 having metal lines 104 (FIG. 5(b)).

Figure 5B:
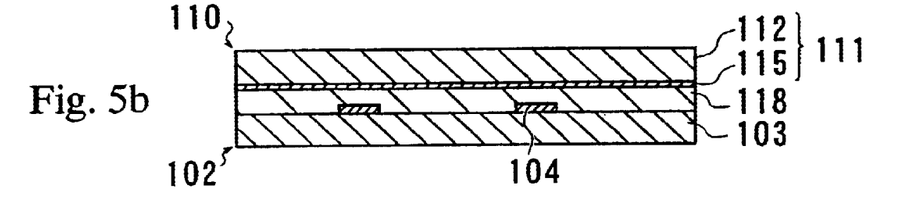
Figure 5C:
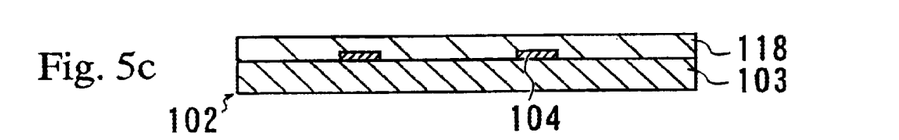

Generally, release agent layer 115 comprises silicone oil, and the adhesive force between silicone oil (release agent layer) and adhesive layer 118 is lower than the adhesive force between silicone oil and substrate 112 and also lower than the adhesive force between adhesive layer 118 and wiring board 102, so that release film 111 is separated from adhesive layer 118 and adhesive layer 118 is left on wiring board 102 when release film 111 is separated in the state shown in FIG. 5(b) (FIG. 5(c)).

Figure 5D:
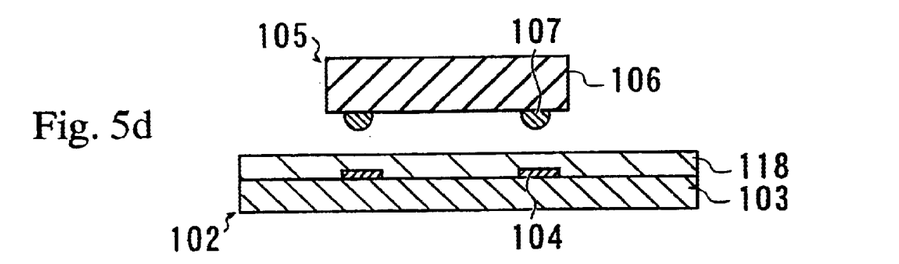
Figure 5E:
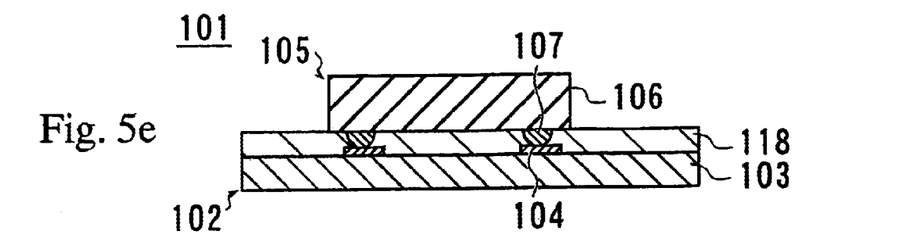

Reference 105 in FIG. 5(d) represents a semiconductor chip comprising a chip body 106 and bump-like connection terminals 107 formed on one side of chip body 106. After the side of semiconductor chip 105 having connection terminals 107 is opposed to the side of wiring board 102 having metal lines 104 and the alignment is adjusted, semiconductor chip 105 is pressed against adhesive layer 118 on wiring board 102 and semiconductor chip 105 is heated under pressure in this state so that connection terminals 107 on semiconductor chip 105 come into contact with the surfaces of metal lines 104 on wiring board 102. Adhesive layer 118 develops adhesiveness by heating to mechanically connect semiconductor chip 105 to wiring board 102, and an electric device 101 shown in FIG. 5(e) is obtained.

When release film 111 having release agent layer 115 is used to form adhesive film 110 in this manner, release film 111 can be easily separated from adhesive layer 118 to connect wiring board 102 and semiconductor chip 105.

However, the release agent consisting of silicone oil has low adhesion to substrate 112, so that release agent layer 115 may be partially removed during preparation of adhesive film 110 or release agent layer 115 may be partially transferred to adhesive layer 118 during separation of release film 111 from adhesive layer 118.

When release agent layer 115 is removed from release film 111, adhesive layer 118 and substrate 112 come into direct contact with each other in the areas lacking the release agent layer and the adhesive force to adhesive layer 118 increases in those areas making it difficult to separate adhesive layer 118 from release film 111.

When release agent layer 115 transferred to the surface of adhesive layer 118 remains, the adhesive force between adhesive layer 118 and semiconductor chip 105 decreases to deteriorate the reliability of the resulting electric device 101.

As described in JPA 5-154857, it is known to use a releasable substrate such as a fluororesin film as a release film without forming a release agent layer.

However, fluororesin films are normally prepared by stretching and elongating the film during the preparation process so that they tend to vary in thickness, which compromises the precision of the width of the resulting films or the precision of the thickness of the adhesive films formed therewith.

When an adhesive layer is directly provided on the surface of a substrate without release agent, the adhesive force between the adhesive layer and the substrate (release film) directly depends on the surface roughness on the surface of the substrate. Therefore, any variation in surface roughness on the surface of the substrate causes variation in the adhesive force between the adhesive layer and the substrate.

SUMMARY OF THE INVENTION

In one aspect, the present invention relates to a release film comprising a substrate and a release agent layer formed on the surface of the substrate wherein the substrate has a surface roughness of 3 μm or less on the side having the release agent layer, and the release agent layer is based on a fluorine compound.

In one embodiment, the present invention provides the release film wherein the substrate has a surface roughness of 1 μm or more and 3 μm or less on the side having the release agent layer.

In another embodiment, the present invention provides the release film wherein the release agent layer is formed by applying a release agent based on the fluorine compound in an amount of 0.01 g or more and 5 g or less per 1 m² on the surface of the substrate.

In another embodiment, the present invention provides the release film wherein the contact angle of the release agent layer to water is between about 100° and about 140° and the contact angle of the release agent layer to silicone oil is between about 30° and about 50°.

In one embodiment, the present invention provides the release film wherein the fluorine compound comprises at least one compound selected from the group consisting of $C_6H_4(CF_3)_2$, $C_8F_{16}O$ and $C_8F_{18}$.

In one embodiment, the present invention provides the release film wherein the substrate has a thickness of between about 12.5 μm and about 100 μm.

In one embodiment, the present invention provides the release film wherein the substrate comprises a polyester resin formed in a film and a filler dispersed in the polyester resin.

In one embodiment, the present invention provides an adhesive film comprising a release film and an adhesive layer wherein the release film has a substrate and a release agent layer formed on the surface of the substrate, the substrate having a surface roughness of 3 μm or less on the side having the release agent layer, and the release agent layer is based on a fluorine compound and the adhesive layer is formed on the surface of the release agent layer.

In one embodiment, the present invention provides the adhesive film wherein the adhesive layer includes a thermosetting resin.

In one embodiment, the present invention provides the adhesive film wherein the thermosetting resin is based on an epoxy resin.

As used herein, the surface roughness means the center line average roughness obtained from the height in direction Z measured by focusing on the surface of an object (substrate) using a laser microscope interferometer (eg, available from Lasertec Corp. sold under the name "Laser Microscope ILM21").

In release films of particular embodiments in accordance with the present invention, the surface roughness of the substrate is 3 μm or less. When a release agent layer is formed on the surface of such a substrate and an adhesive layer is formed on the surface of the release agent layer, the surface roughness on the side of the adhesive layer adhered to the release agent layer becomes 2 μm or less.

If the surface roughness of the adhesive layer is as small as 2 μm or less, excessive air does not enter between the object and the adhesive layer and any bubbles are not formed between the adhesive layer and the object when the side of the adhesive layer separated from the release film is applied on the object.

If the surface roughness of the substrate is greater than about 1 μm, the adhesive layer is not separated from the release film when the adhesive film is slit because irregularities on the surface of the release film produces a moderate frictional force between the release film and the adhesive layer.

Irregularities (roughness) can be formed on the surface of the substrate by adding a filler in the substrate or roughing the surface of the substrate by corona discharge or abrasion or other means.

When a filler is added to the substrate, the surface roughness of the substrate can be controlled by modifying the particle diameter (average particle diameter) or the amount of the filler to be added.

BRIEF DESCRIPTION OF THE DRAWINGS

FIGS. 1 (a)–(c) is a diagram for illustrating a process for preparing an adhesive film.

FIGS. 2 (a)–(e) is a diagram for illustrating a process for preparing an electric device.

FIGS. 5 (a)–(e) is a diagram for illustrating a process for preparing an electric device using an adhesive film of the prior art.

FIGS. 6 (a), (b) is a diagram for illustrating another example of a process for preparing an adhesive film.

DETAILED DESCRIPTION

Figure 1A:
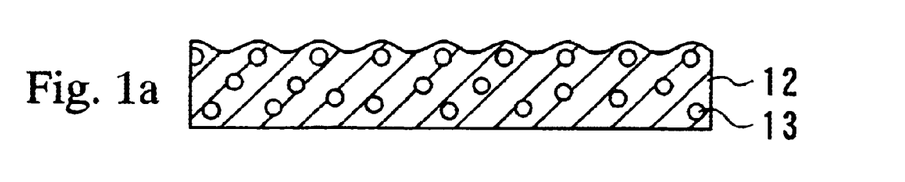

Release films and adhesive films in accordance with embodiments of the present invention together with processes for preparing them are explained in detail below. Reference 12 in FIG. 1(a) represents a substrate. This substrate 12 comprises a polyester resin formed in a film and a filler dispersed in the polyester resin.

Reference 13 in FIG. 1(a) represents a filler in substrate 12, and a surface of substrate 12 is raised by the presence of filler 13 located near the surface of substrate 12. The filler 13 located near the surface of substrate 12 results in the formation of irregularities on the surface of substrate 12.

In order to prepare an adhesive film using this substrate 12, a predetermined amount (between about 0.01 g and about 5 g per 1 $m^2$ of the area on the surface of substrate 12) of a release agent based on a fluorine compound is first applied on the surface of substrate 12. During this process, the amount of the coating solution is small enough that the irregularities on the surface of substrate 12 are not filled with the coating solution.

Figure 1B:
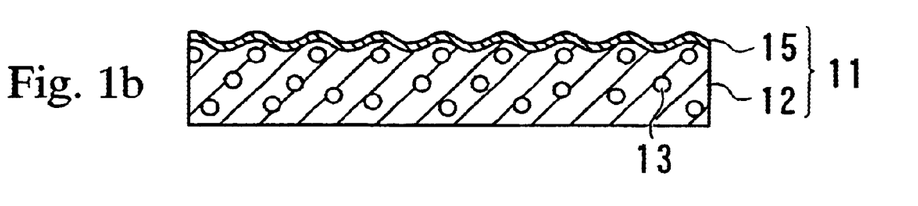

Then, the assembly is dried by heating to form a release agent layer 15 on the surface of substrate 12 (FIG. 1(b)).

Reference 11 in FIG. 1(b) represents a release film in which release agent layer 11 has been formed. Irregularities are formed on the side of release film 11 having release agent layer 15 along to the pattern of the irregularities on the surface of substrate 12. The adhesion between release agent layer 15 and substrate 12 is enhanced greatly by the crosslinked structure formed between the fluorine compound in release agent layer 15 and the polyester resin in substrate 12 during the step of forming release agent layer 15.

Then, a pasty adhesive based on a thermosetting resin is prepared. Release agent layer 15 based on a fluorine compound has high wettability for such an adhesive so that the adhesive is not repelled by release agent layer 15 and an adhesive layer 18 having a uniform thickness is formed when the adhesive is applied on the side of release film 11 having release agent layer 15. Then, the assembly is dried to give an adhesive film 10 of the present invention (FIG. 1(c)).

Figure 1C:
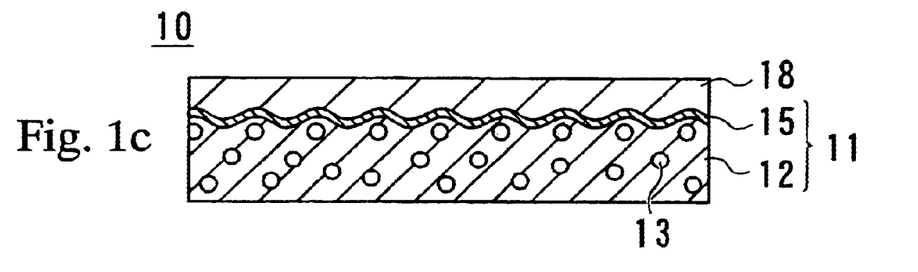

As described above, irregularities are formed on the side of release film 11 having release agent layer 15 along to the pattern of the irregularities on the surface of substrate 12, and therefore, irregularities are also formed on the side of adhesive layer 18 adhered to release agent layer 15 on the surface of the release agent at a surface roughness of 2 μm or less.

Thus, a moderate frictional force occurs between release agent layer 15 and adhesive layer 18 so that the adhesive layer cannot be separated from the release film when this adhesive film 10 is cut into a desired shape.

Next, a process for preparing an electric device using this adhesive film 10 is explained.

Figure 2A:
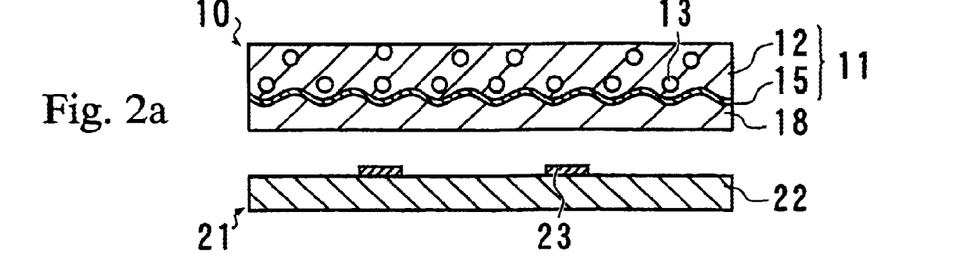

Reference 21 in FIG. 2(a) represents a wiring board comprising a base film 22 and metal lines 23 provided on one side of base film 22. In order to connect a semiconductor chip described below to this wiring board 21, the side of adhesive film 10 having adhesive layer 18 is first pressed against the side of wiring board 21 having metal lines 23 (FIG. 2(b)).

Figure 2B:
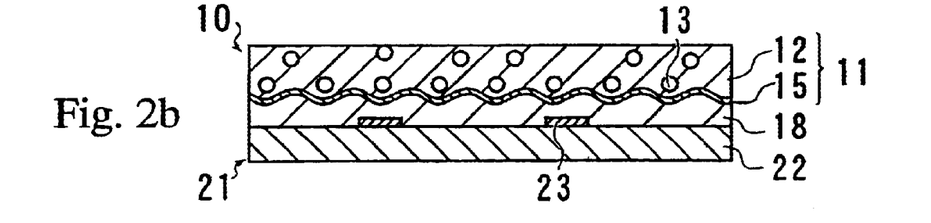
Figure 2C:
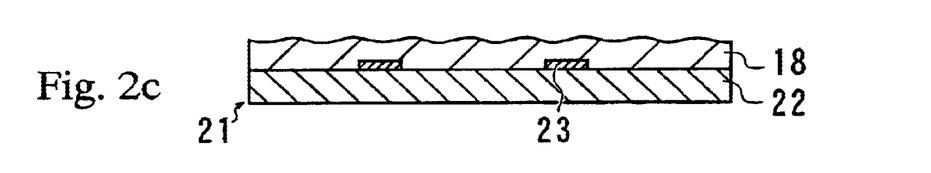

The adhesive force between adhesive layer 18 and wiring board 21 is greater than the adhesive force between adhesive layer 18 and release agent layer 15 and the adhesive force between substrate 12 and release agent layer 15 is also enough large so that release agent layer 15 is not transferred to adhesive layer 18 and only adhesive layer 18 is left on wiring board 21 when release film 11 in the state shown in FIG. 2(b) is separated from adhesive layer 18 (FIG. 2(c)).

Figure 2D:
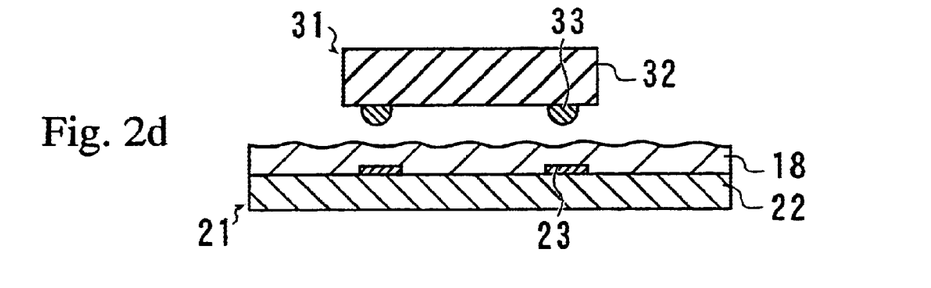

Reference 31 in FIG. 2(d) represents a semiconductor chip. Semiconductor chip 31 comprises a chip body 32 and bump-like connection terminals 33 formed on one side of chip body 32, and connection terminals 33 are connected to the inner circuit not shown of semiconductor chip 31.

The side of semiconductor chip 31 having connection terminals 33 is opposed to the side of wiring board 21 having adhesive layer 18, and the alignment is adjusted in such a manner that connection terminals 33 face metal lines 23.

When semiconductor chip 31 is pressed against the surface of adhesive layer 18, any excessive air does not enter because the side of adhesive layer 18 from which release film 11 has been separated is exposed on wiring board 21 and irregularities are formed on the exposed surface along to the pattern of the irregularities on substrate 12 at a surface roughness of 2 μm or less as described above.

When the assembly is heated while pressuring semiconductor chip 31, adhesive layer 18 softens by heating and connection terminals 33 on semiconductor chip 31 thrust through adhesive layer 18 under pressure to come into contact with metal lines 23 in front of connection terminals 33.

When heating is continued for a given period in this state, adhesive layer 18 hardens while connection terminals 33 are in contact with metal lines 23 and thus semiconductor chip 31 is bonded to wiring board 21 while connection terminals 33 are in contact with metal lines 23, whereby an electric device is obtained.

Figure 2E:
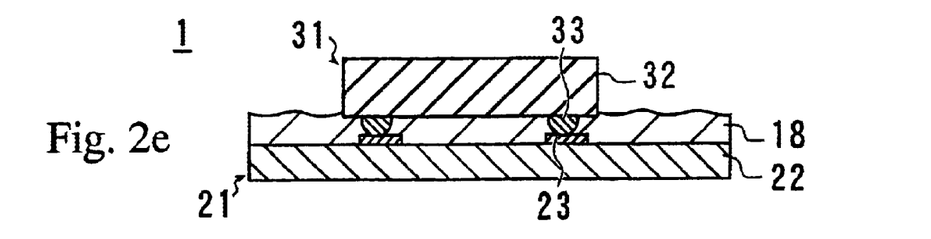

Reference 1 in FIG. 2(e) represents an electric device prepared by the process described above, in which wiring board 21 and semiconductor chip 31 are electrically connected to each other via connection terminals 33. As release agent layer 15 does not remain on adhesive layer 18, wiring board 21 and semiconductor chip 31 are mechanically firmly connected via adhesive layer 18.

Although the foregoing description relates to the case in which release film 11 is adhered to one side of adhesive layer 18, the present invention is not limited thereto.

Figure 3:
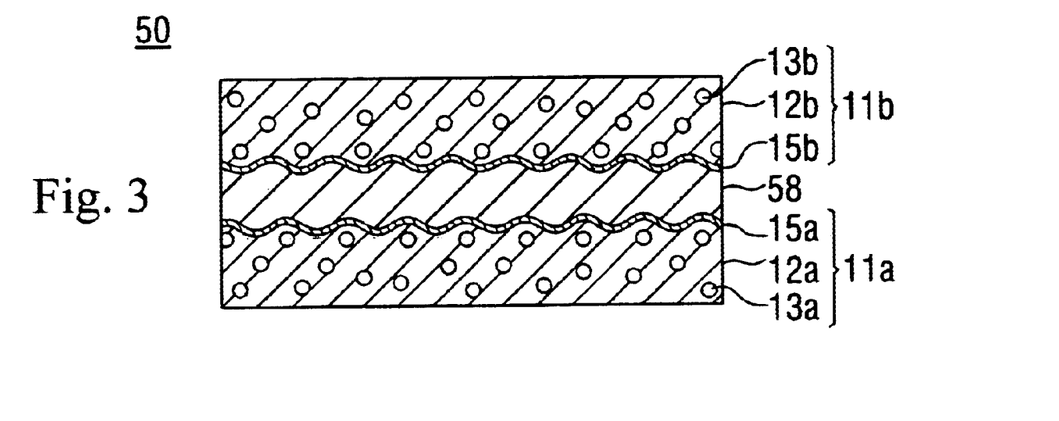
FIG. 3 is a diagram for illustrating another example of an adhesive film.

Reference 50 in FIG. 3 represents another example of an adhesive film of the present invention. Adhesive film 50 comprises an adhesive layer 58 and two release films 11, in which the same members as in release film 11 shown in FIG. 1(b) are designated by the same reference numbers followed by a and b to discriminate members of two release films 11a and 11b, respectively.

Two release films 11a, 11b are adhered on the surface and the bottom of adhesive layer 58, respectively, and electric device 1 can be connected by the process shown in FIGS. 2(a)–(e) after one of these release films 11a, 11b is separated.

Although the foregoing description relates to the case in which semiconductor chip 31 is connected to wiring board 21, the present invention is not limited thereto but can be used for connection of various electric devices such as connection of a TCP (Tape Carrier Package) capable of packaging a semiconductor chip and an LCD (Liquid Crystal Display).

Various fluorine compounds are suitable for forming release agent layer 15, and especially preferred are fluorine compounds represented by $C_6H_4(CF_3)_2$, $C_8F_{16}O$ and $C_8F_{18}$. These fluorine compounds may be used alone or as a mixture of two or more fluorine compounds.

Although the foregoing description relates to the case in which substrate 12 containing filler 13 is used, the present invention is not limited thereto.

Figure 6A:
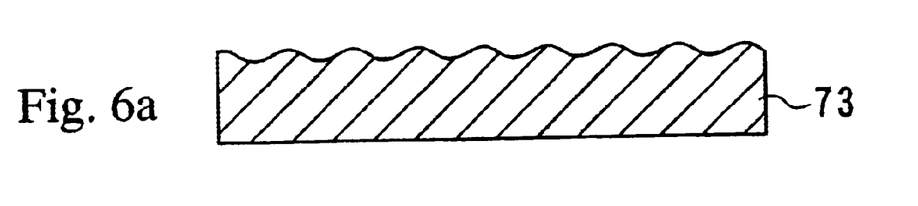

Reference 73 in FIG. 6(a) represents a substrate with no filler. The surface of this substrate 73 has been roughed to a surface roughness of 1 μm or more and 3 μm or less by abrasion with an abrasive or by corona discharge.

Figure 6B:
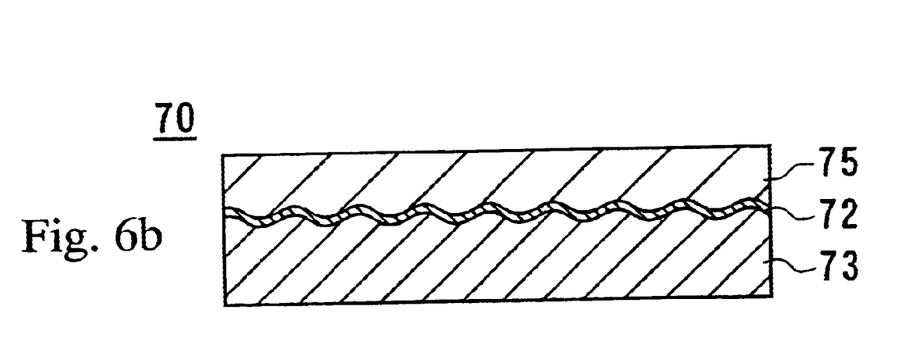

A release agent containing a fluorine compound is applied on the roughed surface of this substrate 73 to form a release agent layer 72 and then an adhesive is applied on the surface of release agent layer 72 to form an adhesive layer 75, whereby an adhesive film 70 is obtained (FIG. 6(b)).

Suitable materials for substrate 12 are various polyester resins, but preferably polyethylene terephthalate from the viewpoint of strength and cost.

Various thermosetting resins such as epoxy resins, urea resins, melamine resins and phenol resins are suitable for adhesive layer 18, but preferably epoxy resins in view of the strength or other properties of the adhesive after thermosetting.

When an epoxy resin is used as a thermosetting resin, it is preferably combined with a hardener, and various hardeners are suitable for the present invention such as imidazole hardeners, polyamine hardeners, phenols, isocyanates, polymercaptans, acid anhydride hardeners, etc. These hardeners may be microencapsulated and used as the so-called latent curing agent.

The adhesive may contain various additives such as antifoamers, colorants, antiaging agents, etc. If the adhesive contains a thermoplastic resin, the adhesion of the adhesive is further enhanced because the cohesive force of the adhesive is promoted by the properties of the thermoplastic resin. Various thermoplastic resins such as phenoxy resins, polyester resins, polyurethane resins, polyvinyl acetal, polyethylene vinyl acetate and rubbers such as polybutadiene rubber can be used for this purpose. Adhesives in which conductive particles are dispersed can also be used to form an adhesive layer.

EXAMPLES

Four substrates 12 consisting of a polyethylene terephthalate (hereinafter abbreviated as PET) film having a filler 13 dispersed therein and having different surface roughnesses and thicknesses and one substrate 12 consisting of a PET film neither containing a filler nor having subjected roughing treatment were prepared. The surface roughnesses and thicknesses of these substrates 12 are shown in Table 1 below.

TABLE 1

Evaluation test result

| | Example 1 | Example 2 | Example 3 | Example 4 | Example 5 | Comparative example 1 | Comparative example 2 |
|---|---|---|---|---|---|---|---|
| Substrate | PET | PET | PET | PET | PET | PET | NITOFLON |
| Filler | Yes | Yes | Yes | Yes | No | Yes | No |
| Release agent layer | Fluorine type | Fluorine type | Fluorine type | Fluorine type | Fluorine type | Silicone | No |
| Coated amount of release agent (g/m$^2$) | 0.01 | 1.0 | 1.0 | 1.0 | 1.0 | 0.3 | — |
| Thickness of substrate ($\mu$m) | 50 | 50 | 25 | 12.5 | 50 | 50 | 75 |
| Surface roughness ($\mu$m) | 3 | 3 | 1 | 1 | 0 | 1 | 5 |
| Slitting | ○ | ○ | ○ | ○ | x | ○ | ○ |
| Processability | ○ | ○ | ○ | x | ○ | ○ | ○ |
| Winding | ○ | ○ | ○ | ○ | ○ | ○ | x |

PET means polyethylene terephthalate.
NITOFLON means a trade name "NITOFLON #900" available from Nitto Denko Corporation.

A release agent based on fluorine compounds was prepared by mixing 75 parts by weight of a fluorine compound $C_8F_{16}O$ and 25 parts by weight of another fluorine compound $C_8F_{18}$ with a fluorine-based solvent consisting of a Freon and a thinner.

The release agent was applied in the amounts shown in the row of "Coated amount" in Table 1 above on one side of the five substrates 12 described above with a gravure coater and dried to form five release films 11.

Then, an adhesive containing 60% by weight of solids was prepared by dissolving and mixing 60 parts by weight of a solid epoxy resin used in an anisotropic conductive adhesive (sold under the name "FP16613") available from Sony Chemicals Corp. in 40 parts by weight of an organic solvent. The adhesive was applied on the surface of release agent layer 15 of each release film 11 with a knife coater and then the assembly was dried at 80° C. for 5 minutes to form an adhesive layer 18 having a thickness of 25 $\mu$m, whereby adhesive films 10 of Examples 1–5 were obtained.

Separately, an adhesive film of Comparative example 1 was prepared under the same conditions as in Example 1 except that silicone oil was used as a release agent in an amount of 0.3 g/m$^2$. An adhesive film of Comparative example 2 having no release agent layer was prepared by forming an adhesive layer on the surface of a fluororesin film (available from Nitto Denko Corporation sold under the name "NITOFLON #900", thickness 75 $\mu$m) by the same process as in Examples 1–5.

These adhesive films of Examples 1–5 and Comparative examples 1 and 2 were subjected to the evaluation tests of "slitting", "processability" and "winding" shown below.

Slitting

Strips of 1.5 mm in width prepared by slitting adhesive film 10 were observed. Evaluation was made as follows: "○" means that adhesive layer 18 of the strip remained adhered to release film 11, and "x" means that adhesive layer 18 was separated from release film 11.

Processability

Adhesive layer 18 was separated alone from adhesive film 10 with a cutter (cutting in half). Evaluation was made as follows: "○" means that adhesive layer 18 was separated without damaging release film 11, and "x" means that release film 11 was broken or adhesive layer 18 was not separated from substrate 12.

Winding

Adhesive films 10 of Examples 1–5 and Comparative examples 1 and 2 having a width of 1.5 mm and a length of 50 m were prepared and these adhesive films 10 were wound up on a reel of 110 cm in diameter under constant tension (10 gf/h) and the resulting adhesive film rolls 10 were stored at 30° C. for 48 hours, after which the state of adhesive layer 18 of adhesive film 10 was observed. Evaluation was made as follows: "○" means that squeeze-out or other defects are not observed in adhesive layer 18 of the adhesive film, and "x" means that adhesive layer 18 was squeezed out.

Table 1 above shows that excellent results in winding were obtained in adhesive films 10 of Examples 1–5 using a PET film containing a filler as substrate 12, in contrast to Comparative example 2 using a fluororesin film as a release film in which squeeze-out of the adhesive film was observed in the adhesive layer after wind-up because the fluororesin film was elongated by wind-up.

Example 4 using substrate 12 having a thickness of 12.5 $\mu$m is inferior in processability (cutting in half) to the other examples, but not practically inconvenient.

Examples 1–4 using substrate 12 having a surface roughness of 1 $\mu$m or more and 3 $\mu$m or less showed excellent slitting performance, while adhesive layer 18 was separated from the surface of release film 11 during slitting but without practical problem in Example 5 using substrate 12 not containing a filler and having a surface roughness of 0 μm.

Examples

Then, the same release agent as used in Example 1 was applied on the surface of the same substrate 12 as used in Example 1 in the amounts shown in Table 2 below to prepare four release films 11. Then, These release films 11 were used to prepare adhesive films 10 of Examples 6–9 by the same process as in Example 1.

TABLE 2

| Evaluation test results | | | | |
|---|---|---|---|---|
| | Example 6 | Example 7 | Example 8 | Example 9 |
| Substrate | filler contaning PET, thickness 50 μm, surface roughness 1 μm | | | |
| Release agent layer | Fluorine type | | | |
| Coated amount of release agnet (g/m²) | 0.1 | 1.0 | 5.0 | 10 |
| Appearance | ○ | ○ | ○ | ○ |
| Release force | 40 | 40 | 40 | 40 |
| Cost | ○ | ○ | Δ | x |
| Adhesive force | | | | |
| Initial | 800 | 800 | 800 | 800 |
| After aging | 800 | 800 | 800 | 800 |
| Electric connection | | | | |
| Initial | ○ | ○ | ○ | ○ |
| After reflowing | ○ | ○ | ○ | ○ |
| Start/end release strength | 1 | 3 | 1 | 2 |

*In the table above, the release force, adhesive force and start/end release strength are expressed in g/cm.

These adhesive films 10 of Examples 6–9 and adhesive films of Examples 1–5 and Comparative examples 1 and 2 described above were subjected to the following tests of "appearance", "release force", "cost", "adhesive force", "electric connection" and "start/end release strength".

Appearance

Adhesive film 10 was observed to evaluate as follows: "○" means that no pinholes resulting from inclusion of bubbles in adhesive layer 18 are observed, and "x" means that pinholes are observed.

Release Force

The force required to separate adhesive layer 18 of adhesive film 10 from release film 11 was determined.

Cost

Production cost of adhesive film 10 was compared with the cost using conventional release PET films and evaluated as follows: "○" means that the production cost is lower, "Δ" means that the production cost is higher but in a feasible range, and "x" means that the production cost is infeasibly too high.

Adhesive Force

Adhesive films of Examples 1–9 and Comparative examples 1 and 2 were used to connect wiring board 21 and semiconductor chip 31 by the process shown in FIGS. 2 (a)–(e) described above and then the force (adhesive force) required to separate wiring board 21 from semiconductor chip 31 was measured (initial). The adhesive films 10 were stored at 50° C. for 24 hours (aging), after which the adhesive force was measured under the same conditions as above (after aging).

A semiconductor chip 31 in a planar shape of a 6.3 mm square comprising 240 connection terminals 33 in a planar shape of a 50 μm square having a height of 20 μ was used, and a wiring board 21 comprising a plurality of metal lines 23 having a width of 50 μm (copper lines of 12 μm in thickness with a gold plating layer on their surfaces) provided at a distance of 50 μm each other on the surface of a polyimide film (base film 22) having a thickness of 20 μ was also used, and both were heat bonded at a heating temperature of 190° C. and a load of 5.85 kPa for 10 seconds.

Electric Connection

Adhesive films 10 of Examples 1–9 and Comparative examples 1 and 2 were used to prepare eleven electric devices 1 by the process shown in FIGS. 2 (a)–(e) described above. Here were used a semiconductor chip 31 comprising 264 connection terminals 33 in a planar shape of a 100 nm square having a height of 20 μm provided at a distance of 150 nm on a chip body 32 in a planar shape of a 1 cm square, and a wiring board 21 comprising copper lines having a thickness of 12 μm (metal lines 23) formed on the surface of a polyimide film (base film 22) having a thickness of 25 μm.

These eleven electric devices 1 were measured for electric connection between wiring board 21 and semiconductor chip 31 (initial), and then these electric devices 1 were heated to 240° C. (reflowing) and measured for electric connection after heating (after reflowing). Measured connection resistance was evaluated as follows: "○" means less than 10 mΩ, "Δ" means 10 mΩ or more and less than 50 mΩ, and "x" means 50 mΩ or more.

Start/End Release Strength

Adhesive films 10 of Examples 1–9 and Comparative example 1 and 2 were prepared in a length of 10 m, and a small piece was cut out from each of one longitudinal end (start) and the other end (end) of the resulting adhesive films 10 and measured for release force under the same conditions as described above for "release force" to determine the difference between the release force of the piece cut out from one end and the release force of the piece cut out from the other end.

Measurement results and evaluation results obtained for Examples 6–7 are shown in Table 2 above, and measurement results and evaluation results obtained for Examples 1–5 and Comparative examples 1 and 2 are shown in Table 3 below.

TABLE 3

Evaluation test result

| | Example 1 | Example 2 | Example 3 | Example 4 | Example 5 | Comparative example 1 | Comparative example 2 |
|---|---|---|---|---|---|---|---|
| Substrate | PET | PET | PET | PET | PET | PET | NITOFLON |
| Filler | Yes | Yes | Yes | Yes | No | Yes | No |
| Release agent layer | Fluorine type | Fluorine type | Fluorine type | Fluorine type | Fluorine type | Silicone | No |
| Coated amount of release agent (g/m$^2$) | 0.01 | 1.0 | 1.0 | 1.0 | 1.0 | 0.3 | — |
| Thickness of substrate ($\mu$m) | 50 | 50 | 25 | 12.5 | 50 | 50 | 75 |
| Appearance | ○ | ○ | ○ | ○ | ○ | ○-Δ | ○-Δ |
| Release force | 40 | 40 | 40 | 40 | 40 | 40 | 80 |
| Cost | ○ | ○ | ○ | ○ | ○ | ○ | Δ |
| Adhesive force | | | | | | | |
| Initial | 800 | 800 | 800 | 800 | 800 | 800 | 800 |
| After aging | 800 | 800 | 800 | 800 | 800 | 700 | 800 |
| Electric connection | | | | | | | |
| Initial | ○ | ○ | ○ | ○ | ○ | ○ | ○ |
| After reflowing | ○ | ○ | ○ | ○ | ○ | Δ | ○ |
| Start/end release strength | 1 | 1 | 3 | 2 | 2 | 15 | 25 |

PET means polyethylene terephthalate
NITOFLON means a trade name "NITOFLON #900" available from Nitto Denko Corporation.
In the table above, the release force, adhesive force and start/end release strength are expressed in g/cm.

Tables 2 and 3 above show that adhesive films of Examples 1–9 showed not only high evaluation in both "appearance" and "electric connection" but also no difference in adhesive force between "initial" and "after aging".

They also showed a small difference in the release strength in the start/end release test, demonstrating that adhesive films 10 of the present invention have more uniform release strength than adhesive films 10 of Comparative examples 1 and 2.

However, Comparative example 1 using silicone oil as a release agent and Comparative example 2 using a fluororesin film with no release agent layer as a release film showed not only bubbles in the adhesive layer but also a large difference in the release strength in the start/end release test.

Especially, Comparative example 1 using silicone oil showed a poor evaluation of "electric connection" after reflowing. This is because connection failure occurred during reflowing due to the silicone oil remaining on the surface of the adhesive layer after the release film has been separated.

Examples

A film-shaped PET (surface roughness 5 $\mu$m) having a filler dispersed therein was used as a substrate to prepare an adhesive film of Comparative example 3 under the same conditions as in Example 1 above. Adhesive layer 18 of each adhesive film 10 of Comparative example 3 and Examples 2, 3 and 5 was separated from release film 11 and the surface roughness was measured on the side of adhesive layer 18 separated from release film 11 (release face) using a laser microscope interferometer available from Lasertec sold under the name "Laser Microscope ILM21". The measurement results are shown in the graph of FIG. 4.

Figure 4:
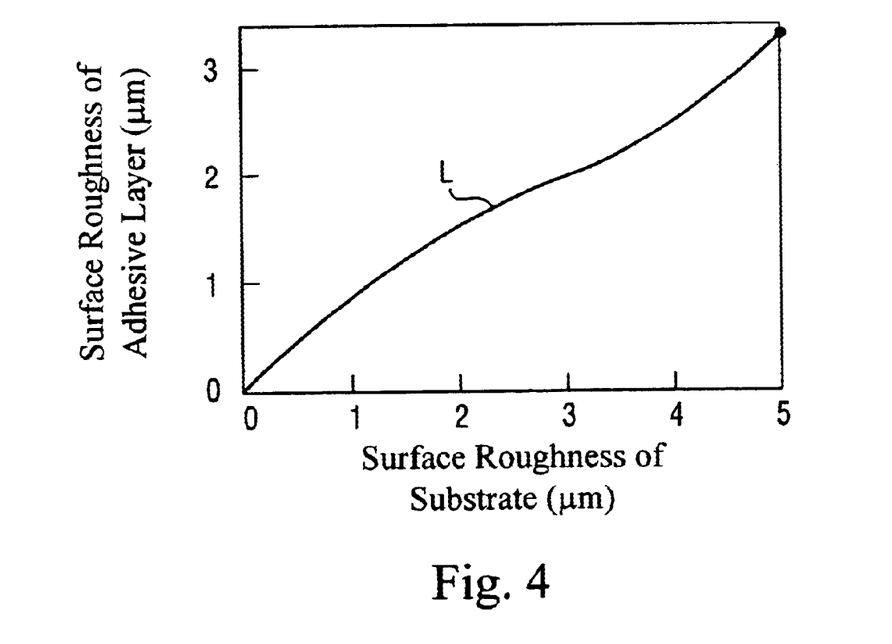
FIG. 4 is a graph showing the relation between the surface roughness of a substrate and the surface roughness of an adhesive layer.

In the graph of FIG. 4, the ordinate indicates the surface roughness ($\mu$m) on the release face of adhesive layer 18 and the abscissa indicates the surface roughness ($\mu$m) of substrate 12, and the reference L in FIG. 4 shows the curve of the resulting graph. FIG. 4 shows that the surface roughness of substrate 12 and the roughness on the release face of adhesive layer 18 correlate to each other and that the surface roughness of adhesive layer 18 exceeds 2 $\mu$m when the surface roughness of substrate 12 exceeds 3 $\mu$m.

Then, adhesive films 10 of Examples 2, 3 and 5 and Comparative example 3 above were subjected to the test of "bubbles" shown below.

Bubbles

A small piece having a width of 2 mm was cut out from each adhesive film 10 to prepare a test piece. Release film 11 of each test piece was separated from adhesive layer 18 and the side of adhesive layer 18 from which release film 11 has been separated was pressed against the surface of a glass substrate and heat-bonded at 80° C. and 3 kgf/cm$^2$ (provisional bonding). Then, adhesive layer 18 was observed after provisional bonding. Evaluation was made as follows: "○" means that no bubbles are observed in adhesive layer 18, "Δ" means that bubbles are observed only at the edges of adhesive layer 18, and "×" means that bubbles observed not only the edges but also the center area of adhesive layer 18. These evaluation results are shown in Table

TABLE 4

Surface roughness of substrate and bubbles in adhesive layer

|  | Example 5 | Example 3 | Example 2 | Comparative example 3 |
|---|---|---|---|---|
| Surface roughness of substrate ($\mu$m) | 0 | 1 | 3 | 5 |
| Bubbles | ○ | ○ | Δ | x |

4 below together with the surface roughness of substrate 12.

Table 4 above shows that little bubbles were observed in adhesive layer 18 of adhesive films 10 of Examples 2, 3 and 5 using a substrate having a surface roughness of 3 $\mu$m or less, among which bubbles were not observed even at the edges of adhesive film 10 in Examples 3 and 5. However, many bubbles were observed between the release film and the adhesive layer in the adhesive film of Comparative example 3 using a substrate having a surface roughness 5 $\mu$m because the surface roughness of the substrate was excessive.

It was demonstrated from these results that bubbles are less liable to be included in adhesive layer 18 when the surface roughness of the substrate is 3 $\mu$m or less.

Examples

Then, the same release film 11 as used in Example 1 above was used as Example 10, and release film 11 of Example 10 was subjected to the tests of "contact angle" and "adhesive repellency" shown below.

Contact Angle

The contact angle of the surface of release agent layer 15 of release film 11 to water was determined. In the same manner, the contact angle of the surface of release agent layer 15 to silicone oil was also determined. The contact angles were determined at a temperature of 25° C. The contact angles determined are shown in the column of water and silicone oil under contact angle in Table 5 below.

Adhesive Repellency

The same adhesive as used in Example 1 was applied on the entire surface of release agent layer 15 of release film 11 cut out into A4 size and the resulting coating film of the adhesive was observed.

Evaluation was made as follows: "○" means that the coating film has a uniform thickness with no pinhole (repellency) observed in the coating film; "○–Δ" means that one or more but three or less pinholes having a diameter of 5 $\mu$m or less are observed on the surface of release agent layer 15; "Δ" means that four or more pinholes are observed on parts of the coating film; and "x" means that pinholes are observed all over the surface of the coating film. These evaluation results are shown in Table 5 below.

TABLE 5

Contact angle to water and silicone oil and appearance evaluation of adhesive layer

| | Release film | | Contact angle | | Appearance |
|---|---|---|---|---|---|
| | Substrate | Release agent layer | Water | Silicone oil | of adhesive layer |
| Comparative example 4 | PET | Silicone oil | 100° | 5° | x |
| Comparative example 5 | White PET | | 120° | 10° | x |
| Comparative example 6 | | | 100° | 30° | Δ |
| Comparative example 7 | | | 110° | 30° | ○–Δ |
| Comparative example 8 | Fluororesin | No | 106° | 20° | ○–Δ |
| Example 10 | PET | Fluorine type | 120° | 45° | ○ |

Comparative examples 4–7 relate to cases in which a release agent layer comprising silicone oil was formed on the surface of a substrate consisting of a PET film. In the release film used in Comparative example 4, an antistatic PET film (thickness 25 $\mu$m) was used as a substrate. In Comparative examples 5–7, a release agent layer was formed using different types of silicone oil on the surface of an antistatic white PET film (containing a filler, thickness 50 $\mu$m). In Comparative example 8, the same release film as used in Comparative example 2 shown above was used.

Table 5 above shows that release film 11 of Example 10 formed a contact angle of the surface of release agent layer 15 to water of between about 100° and about 140° and a contact angle to silicone oil of between about 30° and about 50°. No repellency was found in the coating film in release film 11 of Example 10 having such surface characteristics.

However, Comparative examples 4–7 using silicone oil as a release agent and Comparative example 8 using a fluororesin film having no release agent layer formed a contact angle of 30° or less to silicone oil, and these release films showed repellency in the coating film of the adhesive.

The present invention provides adhesive films having high slitting performance in which no release agent remains in the adhesive layer when the release film has been separated from the adhesive layer. Release films of the present invention include no silicone oil so that no connection failure is caused in electric devices by silicone oil remaining in the adhesive in the electric devices.

While the invention has been described with respect to a limited number of embodiments, those skilled in the art, having benefit of this disclosure, will appreciate that other embodiments can be devised which do not deport from the scope of the invention as disclosed herein. Accordingly, the scope of the invention should be limited only by the attached claims.

What is claimed is:

1. A release film comprising a substrate and a release agent layer formed on the surface of the substrate wherein:

the substrate has a surface roughness of about 3 $\mu$m or less on the side having the release agent layer, the release agent layer is based on a fluorine compound, and the contact angle of the release agent layer to water is between about 100° and about 140° and the contact angle of the release agent layer to silicone oil is between about 30° and about 50°.

2. The release film according to claim 1 wherein the substrate has a surface roughness of between about 1 μm and about 3 μm on the side having the release agent layer.

3. The release film according to claim 1 wherein the release agent layer is formed by applying a release agent based on the fluorine compound in an amount of between about 0.01 g and about 5 g per 1 m² on the surface of the substrate.

4. The release film according to claim 1 wherein the fluorine compound comprises at least one compound selected from the group consisting of $C_6H_4(CF_3)_2$, $C_8F_{16}O$ and $C_8F_{18}$.

5. The release film according to claim 1 wherein the substrate has a thickness of between about 12.5 μm and about 100 μm.

6. The release film according to claim 5 wherein the substrate comprises a polyester resin formed in a film and a filler dispersed in the polyester resin.

7. An adhesive film comprising a release film and an adhesive layer wherein:

the release film comprises a substrate and a release agent layer formed on the surface of the substrate, the substrate has a surface roughness of 3 μm or less on the side having the release agent layer, the release agent layer is based on a fluorine compound, the adhesive layer is formed on the surface of the release agent layer, and the contact angle of the release agent layer to water is between about 100° and about 140° and the contact angle of the release agent layer to silicone oil is between about 30° and about 50°.

8. The adhesive film according to claim 7 wherein the adhesive layer contains a thermosetting resin.

9. The adhesive film according to claim 8 wherein the thermosetting resin is based on an epoxy resin.

* * * * *

UNITED STATES PATENT AND TRADEMARK OFFICE
CERTIFICATE OF CORRECTION

PATENT NO.    : 6,762,504 B1
DATED         : July 13, 2004
INVENTOR(S)   : Yukio Yamada It is certified that error appears in the above-identified patent and that said Letters Patent is hereby corrected as shown below:

The sheet of drawings consisting of figures 5a-5e should be deleted to appear as per attached figures 5a-5e.

Signed and Sealed this

Seventh Day of June, 2005

JON W. DUDAS
*Director of the United States Patent and Trademark Office*